(12) United States Patent
Cha et al.

(10) Patent No.: US 9,765,937 B2
(45) Date of Patent: Sep. 19, 2017

(54) LIGHT SOURCE, A METHOD OF MANUFACTURING THE SAME, AND A BACKLIGHT UNIT HAVING THE SAME

(71) Applicant: SAMSUNG DISPLAY CO., LTD., Yongin, Gyeonggi-Do (KR)

(72) Inventors: HanMoe Cha, Seoul (KR); Seung-Hwa Ha, Gyeonggi-do (KR); HyunJeong Kim, Gyeonggi-do (KR); Sanghyuck Yoon, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 298 days.

(21) Appl. No.: 14/224,608

(22) Filed: Mar. 25, 2014

(65) Prior Publication Data

US 2015/0077970 A1    Mar. 19, 2015

(30) Foreign Application Priority Data

Sep. 13, 2013 (KR) .................. 10-2013-0110651

(51) Int. Cl.
| | |
|---|---|
| *F21K 99/00* | (2016.01) |
| *F21V 9/00* | (2015.01) |
| *F21K 9/90* | (2016.01) |
| *G02F 1/1335* | (2006.01) |
| *F21K 9/64* | (2016.01) |
| *B82Y 20/00* | (2011.01) |

(Continued)

(52) U.S. Cl.
CPC ............ *F21K 9/56* (2013.01); *F21K 9/64* (2016.08); *F21K 9/90* (2013.01); *G02F 1/133617* (2013.01); *H01L 33/507* (2013.01); *B82Y 20/00* (2013.01); *F21Y 2115/10* (2016.08); *G02F 2202/108* (2013.01); *H01L 33/502* (2013.01); *Y10S 977/95* (2013.01); *Y10T 29/4913* (2015.01)

(58) Field of Classification Search
CPC .......... F21K 9/56; F21K 9/90; H01L 33/507; H01L 33/502; G02F 2202/108; G02F 1/133617
USPC ......... 362/84, 293, 231, 235, 351, 230, 455, 362/260, 800
See application file for complete search history.

(56) References Cited

U.S. PATENT DOCUMENTS

| | | | | |
|---|---|---|---|---|
| 6,517,213 B1 * | 2/2003 | Fujita | ............. | G09F 13/04 362/23.18 |
| 7,635,203 B2 * | 12/2009 | Weaver, Jr. | ............. | F21K 9/64 257/98 |

(Continued)

FOREIGN PATENT DOCUMENTS

| | | |
|---|---|---|
| JP | 2004179601 | 6/2004 |
| JP | 2006303373 | 11/2006 |

(Continued)

*Primary Examiner* — Anh Mai
*Assistant Examiner* — Arman B Fallahkhair
(74) *Attorney, Agent, or Firm* — F. Chau & Associates, LLC

(57) ABSTRACT

A light source includes a substrate and a plurality of light emitting devices disposed on the substrate. Each of the light emitting devices is configured to generate a first light. A plurality of quantum-dot devices are respectively disposed on the light emitting devices. The quantum-dot devices are configured to convert the first light to a second light. The quantum-dot devices are configured to be attached to and detached from the light emitting devices, respectively.

25 Claims, 14 Drawing Sheets

(51) Int. Cl.
  *H01L 33/50* (2010.01)
  *F21Y 115/10* (2016.01)

(56) References Cited

U.S. PATENT DOCUMENTS

| | | | |
|---|---|---|---|
| 7,760,971 B2 * | 7/2010 | Chien | G07D 7/121 |
| | | | 359/808 |
| 7,819,539 B2 * | 10/2010 | Kim | H01L 33/507 |
| | | | 313/110 |
| 8,294,168 B2 | 10/2012 | Park et al. | |
| 8,866,182 B2 * | 10/2014 | Wang | H01L 33/486 |
| | | | 257/99 |
| 2015/0261076 A1 * | 9/2015 | Dijken | H01L 33/507 |
| | | | 359/326 |

FOREIGN PATENT DOCUMENTS

| | | |
|---|---|---|
| JP | 2007080864 | 3/2007 |
| KR | 101114412 | 2/2012 |
| KR | 1020120009686 | 2/2012 |
| KR | 1020120018605 | 3/2012 |
| KR | 1020150004180 | 1/2015 |

\* cited by examiner

LIGHT SOURCE, A METHOD OF MANUFACTURING THE SAME, AND A BACKLIGHT UNIT HAVING THE SAME

CROSS-REFERENCE TO RELATED APPLICATION

This U.S. non-provisional patent application claims priority under 35 U.S.C. §119 to Korean Patent Application No. 10-2013-0110651, filed on Sep. 13, 2013, the disclosure of which is incorporated by reference herein in its entirety.

1. TECHNICAL FIELD

Exemplary embodiments of the present invention relate to a light source, a method of manufacturing the same, and a backlight unit having the same.

2. DISCUSSION OF RELATED ART

Display devices, such as a liquid crystal display device, an electrowetting display device, an eletrophoretic display device, etc., have been developed.

A display device may include a display panel that displays an image and a backlight unit that provides light to the display panel. The display panel may control a transmittance of the light provided from the backlight unit to display an image. The light provided to the display panel from the backlight unit may be a white light.

SUMMARY

Exemplary embodiments of the present invention provide a light source capable of preventing a quantum-dot device from being damaged.

Exemplary embodiments of the present invention provide a method of manufacturing the light source.

Exemplary embodiments of the present invention provide a backlight unit having the light source.

Exemplary embodiments of the present invention provide a light source including a substrate and a plurality of light emitting devices disposed on the substrate. Each of the light emitting devices is configured to generate a first light. A plurality of quantum-dot devices are respectively disposed on the light emitting devices. The quantum-dot devices are configured to convert the first light to a second light. The quantum-dot devices are configured to be attached to and detached from the light emitting devices, respectively.

Each of the light emitting devices may include a first case including a recess. A light emitting unit may be disposed in the recess. The light emitting unit may be configured to generate the first light. A plurality of engaging recesses may be disposed in a lower portion of the first case.

Each of the quantum-dot devices may include a second case having a frame shape. A plurality of engaging members are connected to a lower portion of the second case and protruded downward. A quantum-dot member may include a first barrier layer, a second barrier layer, and a quantum-dot layer disposed between the first and second barrier layers. The quantum-dot member may be configured to convert the first light to the second light. The engaging members may be disposed in the engaging recesses, respectively. The first barrier layer and the quantum-dot layer may be disposed in the second case.

The second case may include a first frame having the frame shape. A second frame may be connected to a lower portion of an inner side surface of the first frame and extending vertically with respect to the inner side surface of the first frame. An opening portion may be formed through the second frame. A first hole may be formed through a first side portion of the first frame and may be overlapped with the quantum-dot layer. A second hole may be formed through a second side portion of the first frame and may be overlapped with the quantum-dot layer. A size of the opening portion may be larger than a size of the recess of the first case. The recess may be overlapped with the opening portion. The first case may be disposed under the second frame. The first barrier layer and the quantum-dot layer may be disposed on the second frame and disposed in the first frame.

Each of the engaging members may include a first extension portion connected to the lower portion of the second case and extending in a downward direction. A second extension portion may be connected to a lower portion of an inner side surface of the first extension portion and extending vertically with respect to the inner side surface of the first extension portion. The inner side surface of the first extension portion, which is not connected to the second extension portion, may be in contact with a side surface of the first case at an upper portion of the engaging recess. The second extension portion may be disposed in a corresponding engaging recess of the engaging recesses.

The first light may include blue light and the second light may include white light. The second case and the engaging members may include a plastic resin.

Each of the light emitting devices may include a first case and a light emitting unit disposed in the first case. The light emitting unit may be configured to generate the first light. A first protrusion portion may protrude outward from a lower portion of a side surface of the first case. The first protrusion portion may extend along the side surface of the first case.

Each of the quantum-dot devices may include a second frame connected to an inner side surface of the first frame. The second frame may extend vertically with respect to the inner side surface of the first frame. A first engaging recess may be disposed under the second frame and recessed from a lower portion of the inner side surface of the first frame toward an outer side surface of the first frame. A quantum-dot member may be disposed on the second frame and disposed in the first frame. The quantum-dot member may be configured to convert the first light to the second light. The light emitting devices may be disposed at the lower portion of the second frame and disposed in the first frame. The first engaging recess may extend along the inner side surface of the first frame. The first protrusion portion may be inserted into the first engaging recess.

Each of the light emitting devices may include a first case and a light emitting unit disposed in the first case. The light emitting unit may be configured to generate the first light. A second engaging recess may be recessed from a lower portion of a side surface of the first case toward an inside of the first case.

Each of the quantum-dot devices may include a first frame having a frame shape and a second frame connected to an inner side surface of the first frame and extending vertically with respect to the inner side surface of the first frame. A second protrusion portion may be disposed on a lower portion of the second frame. The second protrusion portion may be protruded from a lower portion of the inner side surface of the first frame toward an inside of the first frame. A quantum-dot member may be disposed on the second frame and disposed in the first frame. The light emitting devices may be disposed at the lower portion of the second frame and disposed in the first frame. The second protrusion portion may extend along the inner side surface of the first frame, and the second protrusion portion may be disposed in the second engaging recess.

Exemplary embodiments of the present invention provide a method of manufacturing a light source including connecting a plurality of light emitting devices to a substrate. The light emitting devices are configured to generate a first light. Quantum-dot devices are disposed on the light emitting devices to convert the first light to a second light. The quantum-dot devices are connected to the light emitting devices, respectively, with the engaging members. The quantum-dot devices are attached to and detached from the light emitting devices, respectively, by the engaging members.

At least one of the light emitting devices may include a first case and a light emitting unit disposed in the first case. The light emitting unit may be configured to generate the first light. A plurality of engaging recesses may be disposed in the first case.

At least one of the quantum-dot devices may include a second case having a frame shape and a plurality of engaging members connected to a lower portion of the second case and protruded downward. At least one of the quantum-dot devices may include a quantum-dot member including a first barrier layer, a second barrier layer, and a quantum-dot layer disposed between the first and second barrier layers to convert the first light to the second light. The engaging members may be inserted into the engaging recesses, respectively. The first barrier layer and the quantum-dot layer may be disposed in the second case.

The second case may include a first frame having the frame shape and a second frame connected to a lower portion of an inner side surface of the first frame and extending vertically with respect to the inner side surface of the first frame. An opening portion may be formed through the second frame. A first hole may be formed through a first side portion of the first frame and may be overlapped with the quantum-dot layer. A second hole may be formed through a second side portion of the first frame and may be overlapped with the quantum-dot layer. A size of the opening portion may be larger than a size of a recess of the first case. The recess may be overlapped with the opening portion. The first case may be disposed under the second frame. The first barrier layer and the quantum-dot layer may be disposed on the second frame and may be disposed in the first frame.

The manufacturing of the quantum-dot devices may further include disposing the first barrier layer on an upper surface of the second frame and disposing the second barrier layer on an upper surface of the first frame. A resin solution containing a plurality of quantum dots may be filled in a first space defined between the first barrier layer and the second barrier layer. The resin solution may be cured to form the quantum-dot layer in the first space.

The filling of the resin solution in the first space may include depositing the resin solution in the first space through the first hole and discharging air in the first space through the second hole.

At least one of the engaging members may include a first extension portion connected to the lower portion of the second case and extending in a downward direction. At least one of the engaging members may include a second extension portion connected to a lower portion of an inner side surface of the first extension portion and extending vertically with respect to the inner side surface of the first extension portion. The inner side surface of the first extension portion, which is not connected to the second extension portion, may be in contact with a side surface of the first case at an upper portion of the engaging recess. The second extension portion may be inserted into a corresponding engaging recess of the engaging recesses.

Exemplary embodiments of the present invention provide a backlight unit including a light source configured to convert a first light to a second light and an optical sheet that diffuses the second light and condenses the second light in an upward direction. The light source includes a substrate and a plurality of light emitting devices connected onto the substrate. Each of the light emitting devices may be configured to generate the first light. A plurality of quantum-dot devices may be respectively disposed on the light emitting devices. Each of the plurality of quantum-dot devices may be configured to convert the first light to the second light. The quantum-dot devices may be configured to be attached to and detached from the light emitting devices, respectively.

Each of the light emitting devices may include a first case including a recess. A light emitting unit may be disposed in the recess of the first case, wherein the light emitting unit is configured to generate the first light. A plurality of engaging recesses may be recessed from a lower portion of the first case to an upper portion of the first case, which is adjacent to a side surface of the first case. Each of the quantum-dot devices may include a second case having a frame shape and a plurality of engaging members connected to a lower portion of the second case and protruded in a downward direction. A quantum-dot member including a first barrier layer, a second barrier layer, and a quantum-dot layer may be disposed between the first and second barrier layers. The quantum-dot member may be configured to convert the first light to the second light. Each of the engaging members may include a first extension portion connected to the lower portion of the second case and extending in a downward direction. A second extension portion may be connected to a lower portion of an inner side surface of the first extension portion and extending vertically with respect to the inner side surface of the first extension portion. The inner side surface of the first extension portion, which is not connected to the second extension portion, may be in contact with a side surface of the first case at an upper portion of the engaging recess, and the second extension portion may be disposed in a corresponding engaging recess of the engaging recesses.

The second case may include a first frame having the frame shape and a second frame connected to a lower portion of an inner side surface of the first frame and extending vertically with respect to the inner side surface of the first frame. An opening portion may be formed through the second frame. A first hole may be formed through a first side portion of the first frame and overlapped with the quantum-dot layer. A second hole may be formed through a second side portion of the first frame and overlapped with the quantum-dot layer. A size of the opening portion may be larger than a size of the recess. The recess may be overlapped with the opening portion. The first case may be disposed under the second frame. The first barrier layer and the quantum-dot layer may be disposed on the second frame and disposed in the first frame.

BRIEF DESCRIPTION OF THE DRAWINGS

The above and other features of the present invention will become more apparent by describing in detail exemplary embodiments thereof, with reference to the accompanying drawings in which.

DETAILED DESCRIPTION OF THE EMBODIMENTS

Hereinafter, exemplary embodiments of the present invention will be described more fully with reference to the accompanying drawings. The present invention may, however, be embodied in many different forms and should not be construed as limited to the embodiments set forth herein.

It will be understood that when an element or layer is referred to as being "on", "connected to" or "coupled to" another element or layer, it can be directly on, connected or coupled to the other element or layer or intervening elements or layers may be present. Like numbers may refer to like elements throughout the specification and drawings.

As used herein, the singular forms, "a", "an" and "the" are intended to include the plural forms as well, unless the context clearly indicates otherwise. Hereinafter, exemplary embodiments of the present invention will be described more fully with reference to the accompanying drawings. The present invention may, however, be embodied in many different forms and should not be construed as limited to the embodiments set forth herein.

Figure 1:
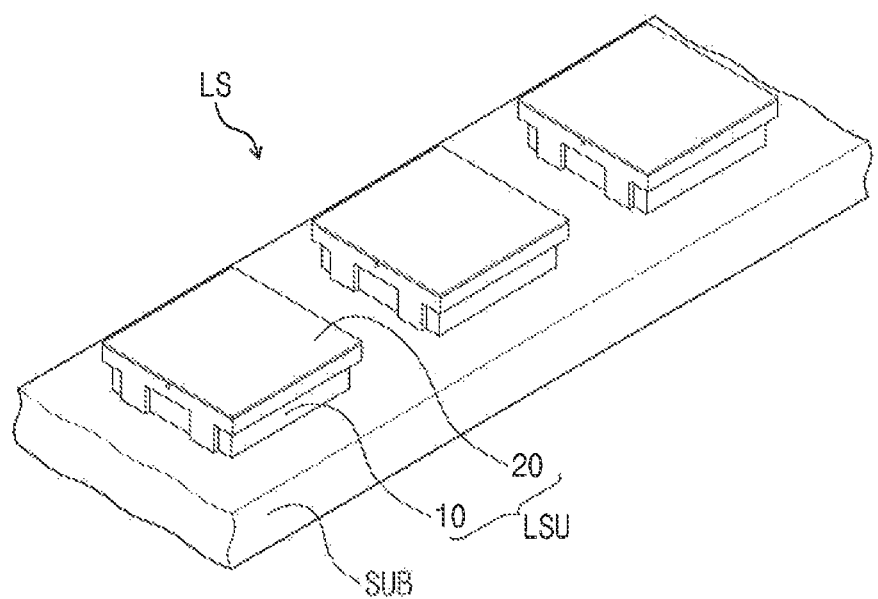
FIG. 1 is a perspective view showing a light source according to an exemplary embodiment of the present invention.

FIG. 1 is a perspective view showing a light source according to an exemplary embodiment of the present invention.

Referring to FIG. 1, a light source LS includes a substrate SUB and a plurality of light source units LSU disposed on the substrate SUB.

The light source units LSU may include a plurality of light emitting devices 10 disposed on the substrate SUB and a plurality of quantum-dot devices 20 disposed at positions to respectively correspond to the light emitting devices 10.

The light emitting devices 10 may be disposed on the substrate SUB and spaced apart from each other by a predetermined distance. Each of the quantum-dot devices 20 may be connected to a corresponding light emitting device of the light emitting devices 10.

The light emitting devices 10 may generate a first light. The quantum-dot devices 20 may convert the first light to a second light. For example, the first light may be a blue light and the second light may be a white light.

Hereinafter, configurations of the light emitting devices 10 and the quantum-dot devices 20 will be described in more detail.

Figure 2:
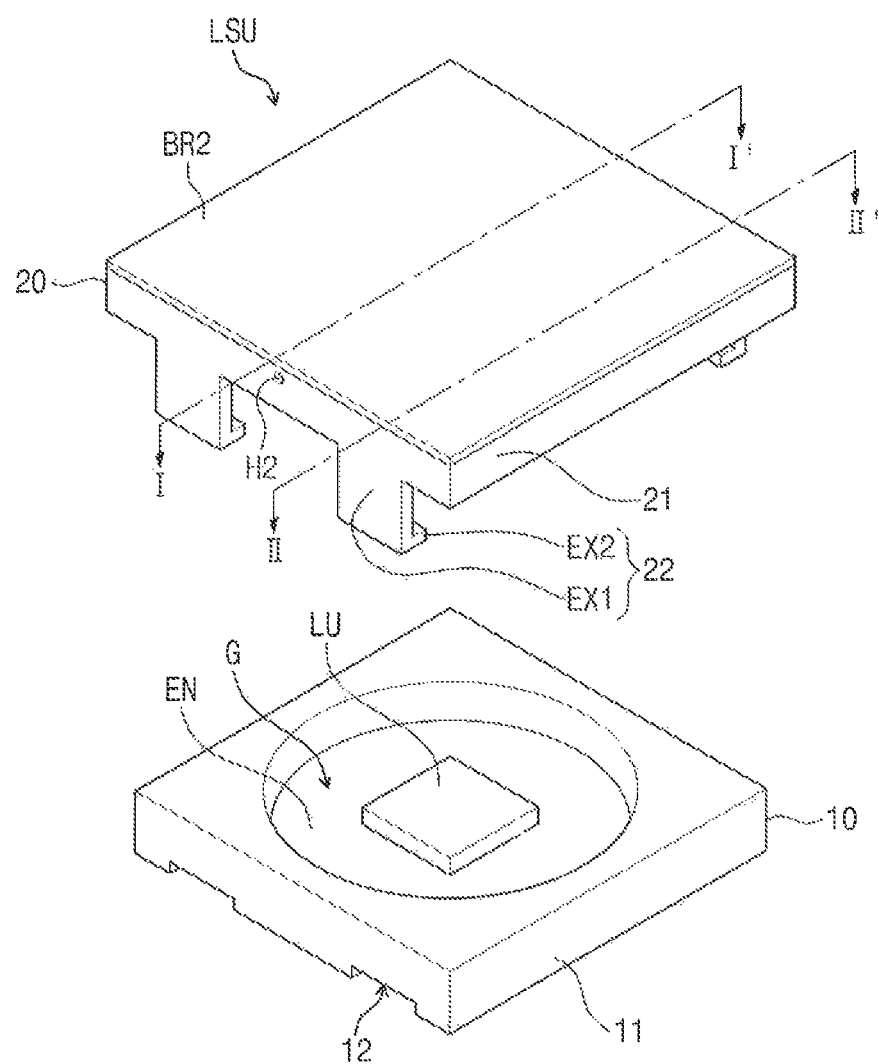
FIG. 2 is an exploded perspective view showing a light source unit shown in FIG. 1.
Figure 3:
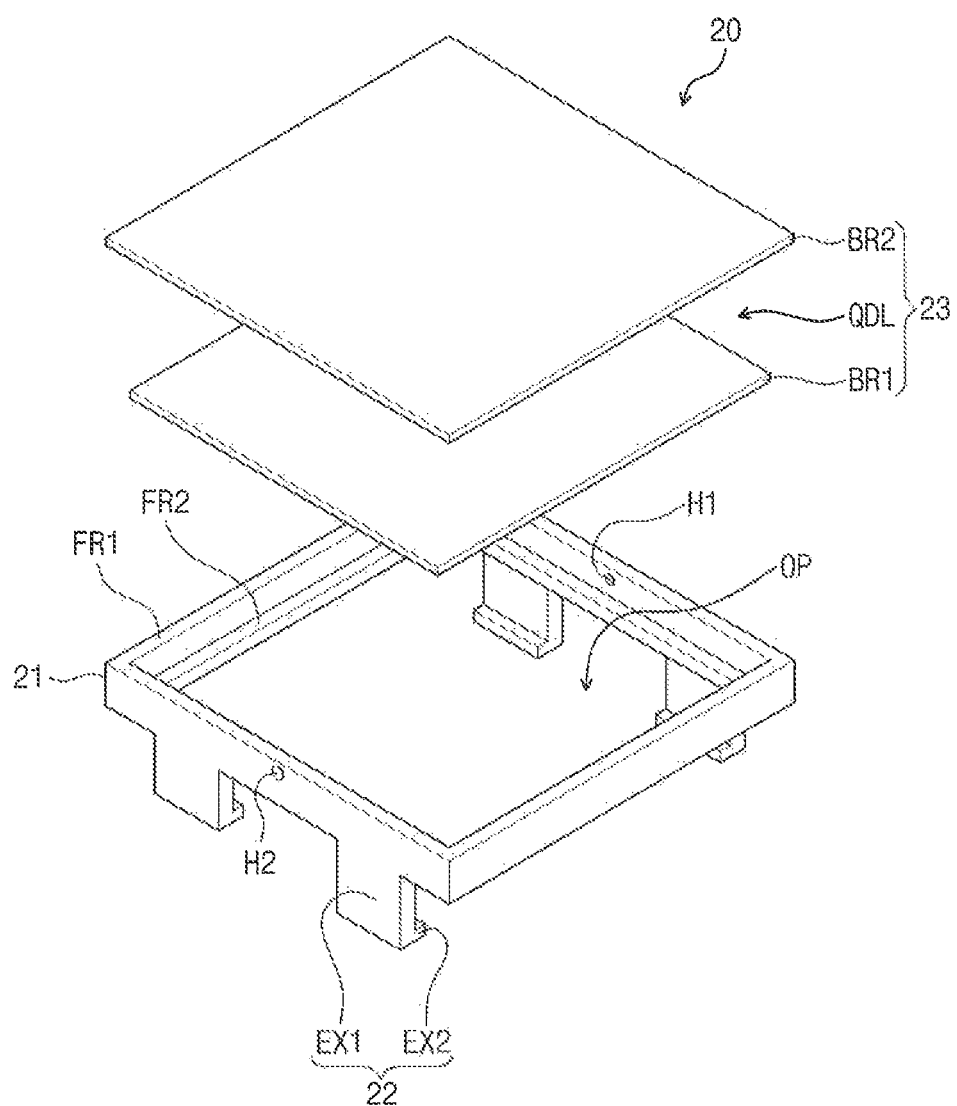
FIG. 3 is an exploded perspective view showing a quantum-dot device shown in FIG. 2.

FIG. 2 is an exploded perspective view showing the light source unit shown in FIG. 1 and FIG. 3 is an exploded perspective view showing a quantum-dot device shown in FIG. 2.

For convenience of explanation, only one light source unit LSU has been shown in FIG. 2. The light source units LSU shown in FIG. 1 may have the same configuration and function as the light source unit LSU shown in FIG. 2.

Referring to FIGS. 2 and 3, the light source unit LSU includes the light emitting device 10 and the quantum-dot device 20 disposed on the light emitting device 10.

The light emitting device 10 may include a first case 11, a recess G, a light emitting unit LU, a sealing member EN, and a plurality of engaging recesses 12.

The recess G may be formed by downwardly recessing a portion of the first case 11 from an upper surface of the first case 11. The light emitting unit LU may be disposed on a bottom surface of the recess G. The light emitting unit LU may generate the first light. The light emitting unit LU may be a blue light emitting diode and may generate the blue light.

The sealing member EN may be disposed in the recess G. The sealing member EN may cover the light emitting unit LU. The sealing member EN may hold the light emitting unit LU and may protect the light emitting unit LU from external moisture and contaminant, for example. The first light generated by the light emitting unit LU may be transmitted through the sealing member EN.

The engaging recesses 12 may be formed by upwardly recessing a lower portion of the first case 11. The lower portion of the first case 11 may be adjacent to a side surface of the first case 11. The engaging recesses 12 may be disposed to face each other. For example, a plurality of engaging recesses 12 may be disposed at a lower side portion of the first case 11 and a plurality of engaging recesses 12 may be disposed at the other lower side portion of the first case 11. The plurality of engaging recesses 12 disposed at the lower side portion of the first case 1 may face the engaging recesses 12 disposed at the other lower side portion of the first case 11.

For example, FIG. 2 shows two engaging recesses 12 disposed at the lower side portion of the first case 11. Two engaging recesses 12 may be disposed at the other lower side portion of the first case 11. In addition, the number of the engaging recesses 12 is not limited to the above-mentioned numbers.

The quantum-dot device 20 may include a second case 21, a plurality of engaging members 22, and a quantum-dot member 23.

The second case 21 may have a frame shape, for example. The second case 21 may includes a plastic resin. The second case 21 may be formed by an injection molding method, a compression molding method, or an extrusion molding, for example.

The second case 21 may include a first frame FR1, a second frame FR2, an opening portion OP, a first hole H1, and a second hole H2.

The first frame FR1 may have a frame shape, for example. An inner side surface of the first frame FR1 may be disposed to correspond to a side surface of the first case 11.

The second frame FR2 may be connected to a lower portion of the inner side surface of the first frame FR1. The second frame FR2 may extend vertically with respect to the inner side surface of the first frame FR1.

The opening portion OP may be formed through the second frame FR2. When viewed in a plan view, a size of the opening portion OP may be larger than that of the recess G. The recess G may overlap the opening portion OP in a plan view. The recess G may have a circular shape, for example. The opening portion OP may have a rectangular shape, for example, when viewed in a plan view.

The first hole H1 may penetrate through a portion of the first frame FR1. The second hole H2 may penetrate through another portion of the first frame FR1. The second hole H2 may face the first hole H1. The first and second holes H1 and H2 may be located at an upper portion of the second frame FR2.

The engaging members 22 may be connected to a lower portion of the second case 21. The engaging members 22 may protrude in a downward direction. The engaging members 22 may correspond to the engaging recesses 12, respectively. The number of the engaging members 22 may be equal to the number of the engaging recesses 12. The engaging members 22 may be disposed to respectively correspond to the engaging recesses 12.

The engaging members 22 may include a plastic resin. The engaging members 22 may be formed by an injection molding method, a compression molding method, or an extrusion molding, for example. The engaging members 22 may be flexible, and the engaging members 22 may be bent. The engaging members 22 may be inserted into the engaging recesses 12, respectively.

Each of the engaging members 22 may include a first extension portion EX1. The first extension portion EX1 may be connected to the lower portion of the second case 21. Each of the engaging members 22 may include a second extension portion EX2. The second extension portion EX2 may be connected to an inner side surface of the first extension portion EX1.

For example, the first extension portion EX1 may be connected to the lower portion of the second frame FR2 of the second case 21. The first extension portion EX1 may extend in a downward direction. The second extension portion EX2 may be connected to the lower portion of the inner side surface of the first extension portion EX1. The second extension portion EX2 may extend in a vertical direction with respect to the inner side surface of the first extension portion EX1.

The quantum-dot member 23 may be disposed in the second case 21. The quantum dot member 23 may include a first barrier layer BR1, a second barrier layer BR2, and a quantum-dot layer QDL. The quantum-dot layer QDL may be disposed between the first barrier layer BR1 and the second barrier layer BR2.

The first barrier layer BR1 may be disposed on the second frame FR2 and the second barrier layer BR2 may be disposed on the first frame FR1. The first and second barrier layers BR1 and BR2 may include polyethyleneterephthalate (PET).

When the quantum-dot member 23 is disposed in the second case 21, upper and side surfaces of the second barrier layer BR2 may be exposed, as shown in FIG. 2, for example. The quantum-dot layer QDL and the first barrier layer BR1 may be disposed in the second case 21.

An exemplary structure in which the quantum-dot member 23 is disposed in the second case 21 will be described in more detail with reference to FIG. 5.

Figure 4:
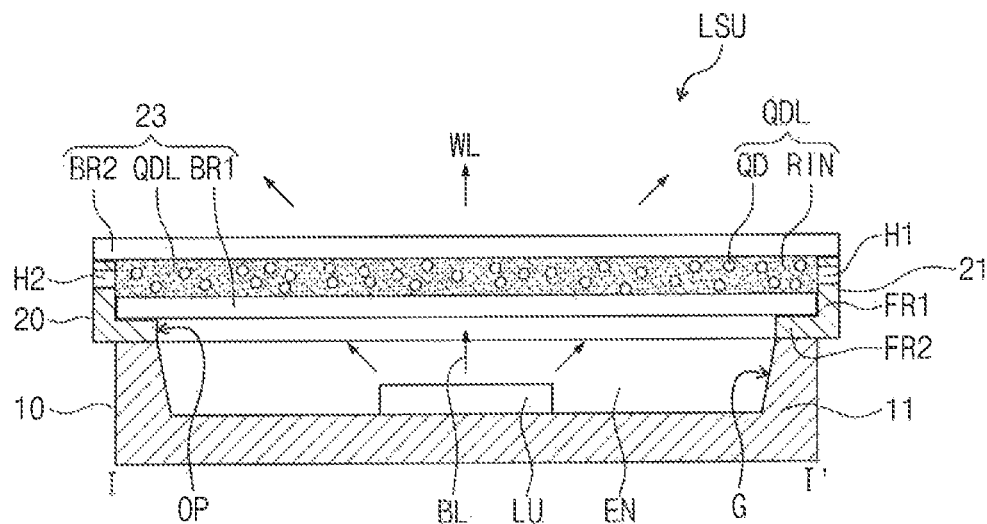
FIG. 4 is a cross-sectional view taken along line I-I' shown in FIG. 2.
Figure 5:
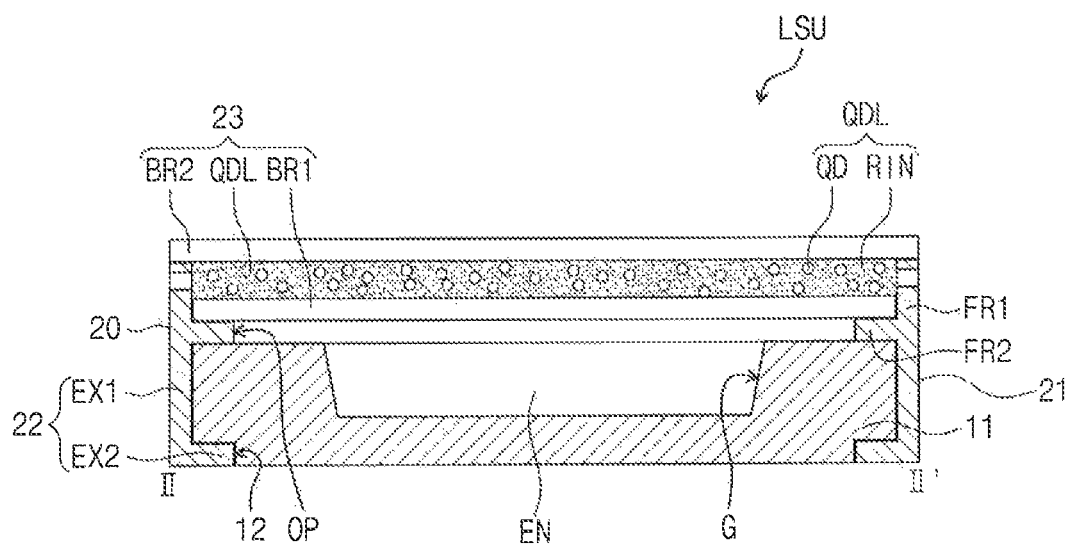
FIG. 5 is cross-sectional view taken along line II-II' shown in FIG. 2.

FIG. 4 is a cross-sectional view taken along line I-I' shown in FIG. 2 and FIG. 5 is cross-sectional view taken along line II-II' shown in FIG. 2.

Referring to FIGS. 4 and 5, the quantum-dot device 20 may be disposed on the light emitting device 10. The recess G may overlap the opening portion OP. The light emitting device 10 may be disposed under the second frame FR2. For example, the first case 11 of the light emitting device 10 may be disposed under the second frame FR2.

The first barrier layer BR1 may be disposed on the second frame FR2. For example, the first barrier layer BR1 may be disposed on an upper surface of the second frame FR2. The second barrier layer BR2 may be disposed on the first frame FR1. For example, the second barrier layer BR2 may be disposed on an upper surface of the first frame FR1.

A predetermined portion of the quantum-dot member 23 may be disposed in the second case 21. For example, the quantum-dot member 23 may be disposed on the second frame FR2. The first barrier layer BR1 and the quantum-dot layer QDL may be disposed on the second frame FR2. The first barrier layer BR1 and the quantum-dot layer QDL may be disposed in the first frame FR1.

The second barrier layer BR2 of the quantum-dot member 23 might not be disposed in the second case 21. The upper and side surfaces of the second barrier layer BR2 may be exposed. The first and second holes H1 and H2 may overlap the quantum-dot layer QDL.

The engaging members 22 may be respectively disposed in the engaging recesses 12. For example, the inner side surface of the first extension portion EX1, which might not be connected to the second extension portion EX2, may be in contact with the side surface of the first case 11 at an upper portion of the engaging recesses 12. The second extension portion EX2 may be disposed in a corresponding engaging recess of the engaging recesses 12. According to the above-mentioned exemplary structure, for example, the quantum-dot device 20 may be connected to the light emitting device 10.

As described above, for example, the engaging members 22 may include a plastic resin and may have a flexibility to be bent. For example, when a predetermined force is applied in a downward direction to the quantum-dot device 20 when the quantum-dot device 20 is disposed on the light emitting device 10, the engaging members 22 may be disposed in the engaging recesses 12 and may be attached to or coupled to the engaging recesses 12.

For example, when a predetermined force is applied in an upward direction to the quantum-dot device 20 when the engaging members 22 are disposed in the engaging recesses 12, the engaging members 22 may be detached from or separated from the engaging recesses 12. The quantum-dot device 20 may be attached to or detached from the light emitting device 10 by the engaging members 22 and the engaging recesses 12.

The quantum-dot layer QDL may include a resin member RIN and a plurality of quantum dots QD disposed in the resin member RIN. The quantum dots QD may randomly change the wavelength of light and may mix lights having different wavelengths with each other.

Each quantum dot QD may be a particle having a predetermined size with a quantum confinement effect. Each quantum dot QD may have a size of about 2 nm to about 15 nm and may include a core and a shell surrounding the core.

The core of the quantum dots QD may include cadmium selenide (CdSe), cadmium telluride (CdTe), and/or cadmium sulfide (CdS). The shell of the quantum dots QD may be formed of zinc sulfide (ZnS).

The quantum dots QD may be synthesized by a chemical vapor method, for example. The chemical vapor method may synthesize particles by adding a precursor material to an organic solvent. The synthesis of the quantum dots QD may be performed by other methods, for example.

The quantum dots QD may generate relatively strong fluorescence in a narrow wavelength band. The light generated by the quantum dots QD may be generated when electrons in an unstable state fall from a conduction band to a valence band.

The fluorescence generated by the quantum dots QD may generate light with a short wavelength as the quantum dots QD become smaller and may generate light with a long wavelength as the quantum dots QD become larger. Lights having various wavelengths may be generated by the quantum size effect, for example.

According to the size of the quantum dot QD, light with a rainbow color including red, green, and/or blue colors may be generated. For example, light emitting diodes (LEDs) that emit light in accordance with the size of each of the quantum dots QD may be manufactured, and various colors may be generated by mixing the quantum dots QD having various sizes.

The quantum dots QD may have a high light emission property. When white light is generated by the quantum dots QD, a color reproducibility of the green and blue colors may be higher than that of a conventional white LED.

The quantum dot layer QDL may include the quantum dots QD having different sizes according to the color of the light generated by the light emitting device 10 to generate white light as a second light. For example, the light emitting device 10 may generate blue light, as described above.

The quantum-dot member 23 may include the quantum dots QD each having a size to absorb light having a blue wavelength and emit light having a green wavelength. The quantum dots QD may each have a size to emit light having a red wavelength.

Blue light BL generated by the light emitting device 10 may be transmitted to the quantum-dot member 23 after passing through the opening portion OP. The quantum dots QD of the quantum-dot member 23 may absorb the blue light BL and convert the blue light BL to light having a green or red wavelength. Lights having blue, green, and/or red wavelengths may be mixed with each other, and white light WL may be generated as the second light.

For example, blue light BL generated by the light emitting device 10 may be converted to white light WL while passing through the quantum-dot member 23. The quantum-dot member 23 may convert blue light BL generated by the light emitting device 10 as the first light to white light WL as the second light.

The quantum-dot device 20 may be connected to and fixed to the light emitting device 10 without being attached to and detached from the light emitting device 10. The light source unit LSU may include the quantum-dot device 20 and the light emitting device 10, which may be connected to and fixed to each other. The light source LS including the quantum-dot device 20 and the light emitting device 10, which may be connected to and fixed to each other may be connected to the substrate SUB.

For example, a solder paste may be disposed on the substrate SUB as an adhesive member. The light source unit LSU may be disposed on the adhesive member. Heat may be applied to the adhesive member to heat the adhesive member. When the adhesive member is melted by the heat, the light source unit LSU may be attached to the substrate SUB by the melted adhesive member. When the adhesive member is cooled, the light source unit may be fixed to the substrate SUB. This process may be referred to as a reflow process.

The first and second barrier layers BR1 and BR2 of the quantum-dot device 20 may be expanded and deformed by the heat applied to the adhesive member during the reflow process. When the first and second barrier layers BR1 and BR2 are deformed, a light transmittance may be varied, and brightness may be lowered.

The quantum dots QD of the quantum-dot device 20 may be damaged by the heat applied to the adhesive member during the reflow process. The quantum-dot device 20 may be damaged by the heat applied to the adhesive member during the reflow process. The damaged quantum dots QD might not perform the light conversion process.

For example, when the quantum-dot device 20 is connected to and fixed to the light emitting device 10, the quantum-dot member 23 may be fixed to the case by a fixing member, e.g., a heat-curable resin. To cure the fixing member, a heat may be applied to the fixing member, for example.

For example, when heat is applied to the fixing member, the first and second barrier layers BR1 and BR2 may be deformed and the quantum dots QD and the quantum-dot device 20 may be damaged.

The quantum-dot device 20 according to the exemplary embodiments of the present invention may be attached to and detached from the light emitting device 10. The quantum-dot device 20 may be connected to the light emitting device 10 after the light emitting device 10 is connected to the substrate SUB by the reflow process.

The quantum-dot device 20 might not be affected by the heat applied to the adhesive member during the reflow process. The first and second barrier layers BR1 and BR2 and the quantum dots QD may be prevented from being damaged. The quantum-dot device 20 might not be damaged.

A separate fixing member used to fix the quantum-dot member 23 might not be used according to exemplary embodiments of the present invention. The heat used to cure the fixing member might not be applied to the quantum-dot device 20. The first and second barrier layers BR1 and BR2 and the quantum dots QD may be prevented from being damaged. The quantum-dot device 20 might not be damaged.

The light source LS according to exemplary embodiments of the present invention may prevent the quantum-dot member 20 from being damaged.

FIGS. 6A to 6G are views showing a manufacturing method of a light source according to an exemplary embodiment of the present invention.

Figure 6A:
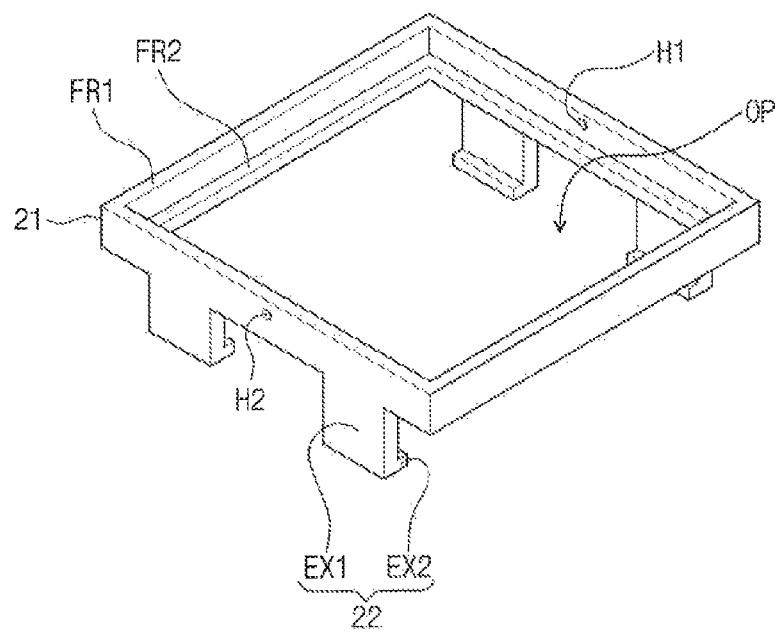
FIGS. 6A to 6G are views showing a manufacturing method of a light source according to an exemplary embodiment of the present invention.
Figure 6B:
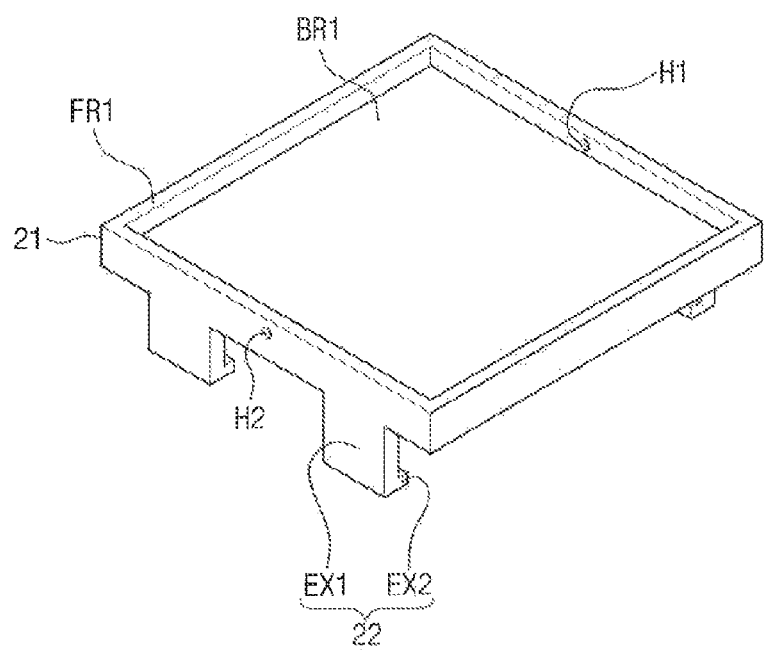
Figure 6C:
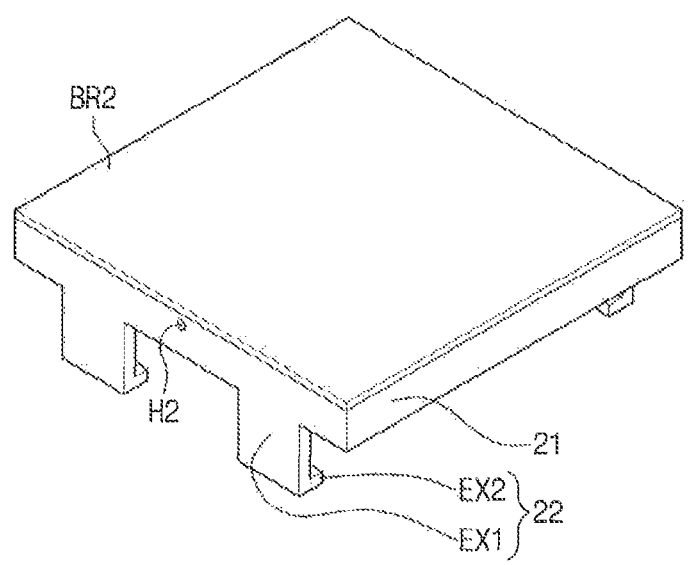
Figure 6D:
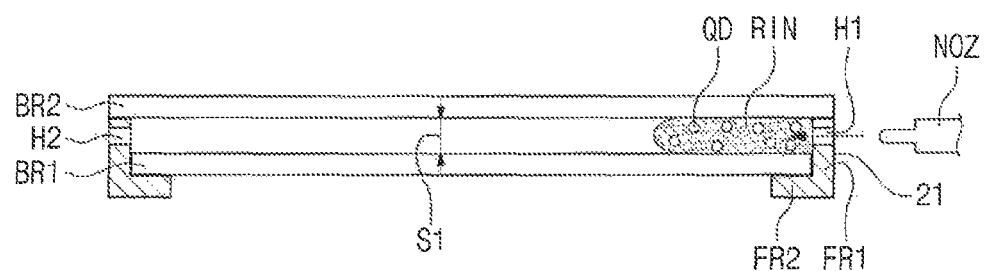
Figure 6E:
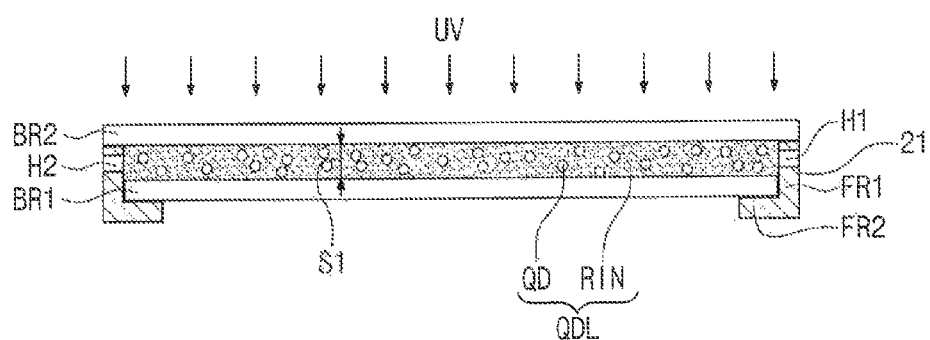

For the convenience of explanation, FIGS. 6D and 6E show cross-sectional views taken along the line I-I' shown in FIG. 2.

Referring to FIG. 6A, the second case 21 to which the engaging members 22 may be connected may be prepared. The second case 21 and the engaging members 22 may include a plastic resin and may be manufactured by an injection molding method, a compression molding method, or an extrusion molding method, for example.

Referring to FIGS. 6B and 6C, the first barrier layer BR1 may be disposed on the second frame FR2. The first barrier layer BR1 may be disposed in the second case 21 after being disposed on the second frame FR2. The second barrier layer BR2 may be disposed on the first frame FR1.

Referring to FIG. 6D, a first space S1 may be defined as a space between the first and second barrier layers BR1 and BR2. The first and second holes H1 and H2 may overlap the first space S1.

A resin solution RIN in which the quantum dots QD may be distributed may be discharged from a nozzle NOZ. The resin solution RIN may include an ultraviolet-ray-curable resin. The resin solution RIN may be deposited in the first space S1 through the first hole H1.

When the first space S1 is filled with the resin solution RIN, air in the first space S1 may be discharged through the second hole H2. For example, when the air in the first space S1 is discharged through the second hole H2, the first space S1 may be filled with the resin solution RIN.

Referring to FIG. 6E, an ultraviolet ray (UV) may be radiated to the resin solution RIN filled in the first space S1. The resin solution RIN may be cured and the resin member RIN may be formed. The quantum-dot layer QDL that includes the resin member RIN and the quantum dots QD distributed in the resin member RIN may be formed in the first space S1.

Figure 6F:
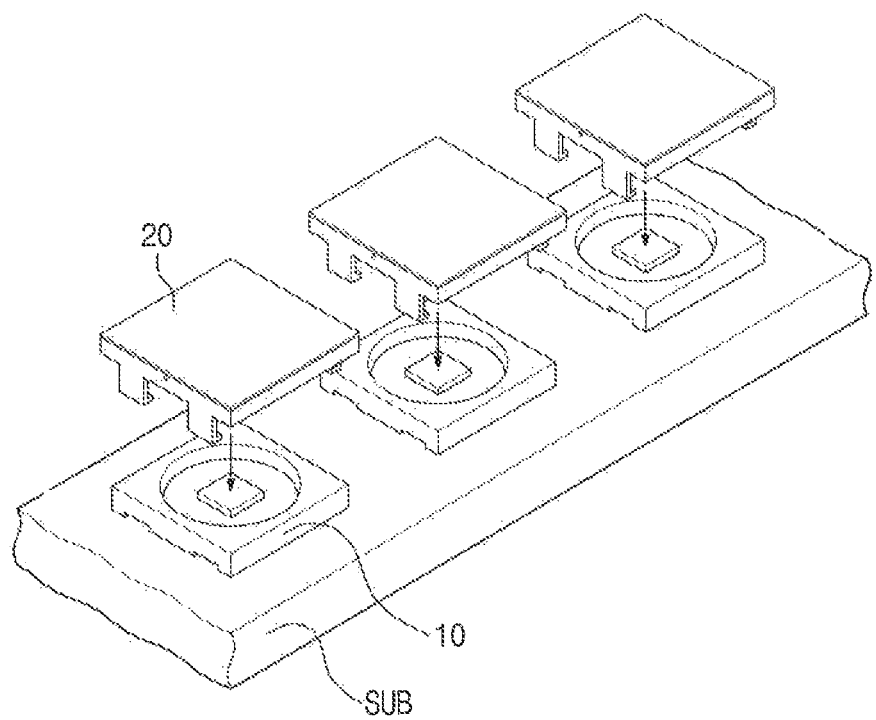

Referring to FIG. 6F, the light emitting devices 10 may be disposed on the substrate SUB and may be spaced apart from each other. The light emitting devices 10 may be connected to the substrate SUB by the above-mentioned reflow process. The quantum-dot devices 20 may be disposed on the light emitting devices 10, respectively.

Figure 6G:
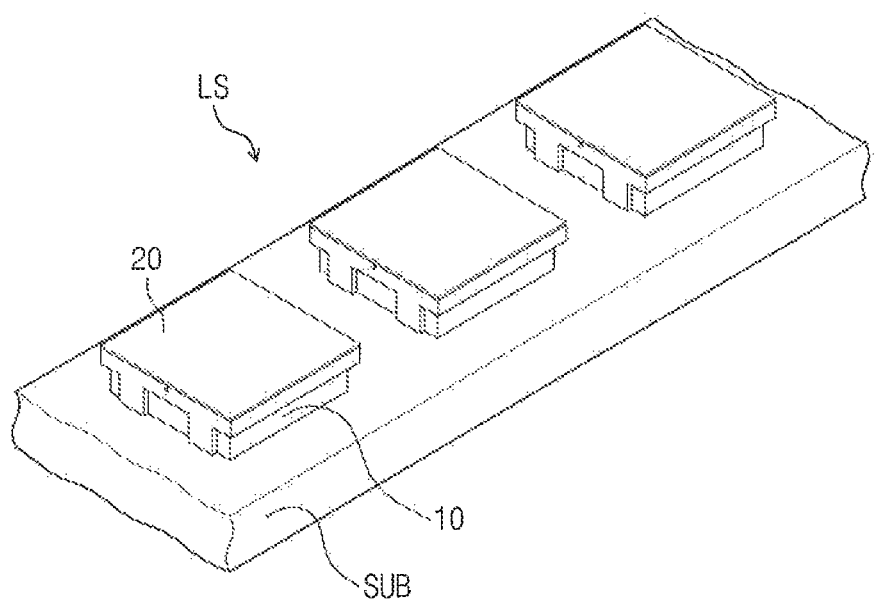

Referring to FIG. 6G, each of the quantum-dot devices 20 may be connected to the corresponding light emitting device of the light emitting devices 10. The connection between the quantum-dot devices 20 and the light emitting devices 10 may be formed according to the exemplary embodiments of the invention described above.

In the manufacturing method of the light source LS, the separate fixing member used to fix the quantum-dot member 23 might not be used. The heat used to cure the fixing member might not be applied to the quantum-dot device 20. The quantum-dot device 20 might not be damaged.

For example, the quantum-dot device 20 may be connected to the light emitting device 10 after the light emitting device 10 is connected to the substrate SUB by the reflow process. The quantum-dot device 20 might not be affected by the heat applied to the adhesive member during the reflow process. The quantum dot device 20 might not be damaged.

The manufacturing method of the light source LS according to the exemplary embodiments of the present invention may prevent the quantum-dot member 20 from being damaged.

Figure 7:
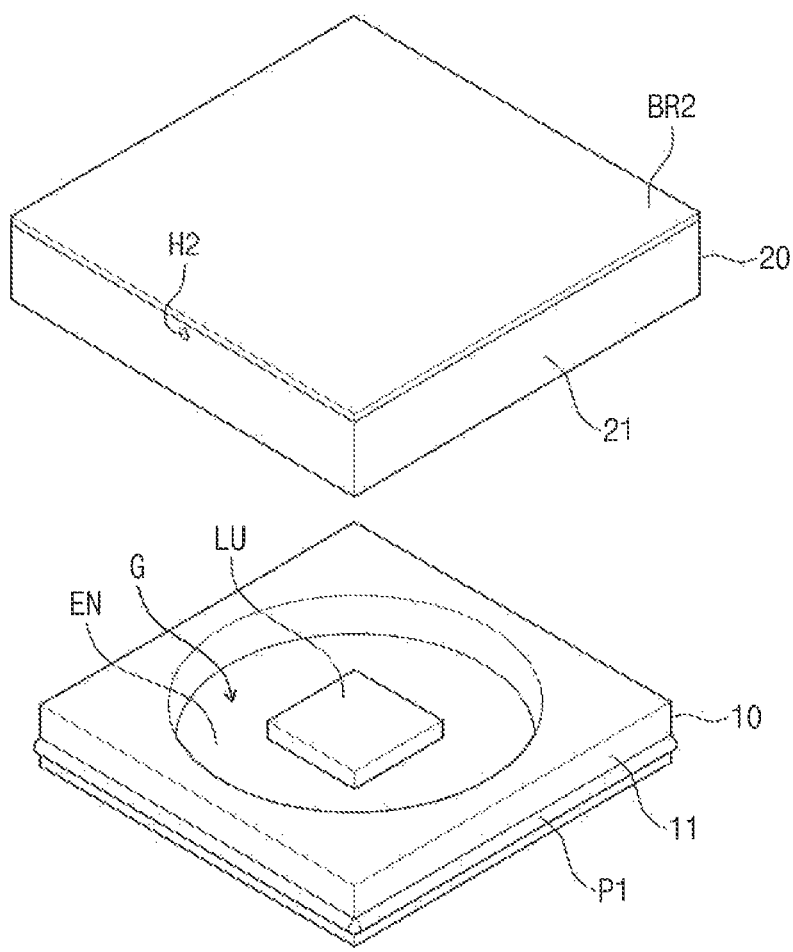
FIG. 7 is an exploded perspective view showing a light source unit of a light source according to an exemplary embodiment of the present invention.
Figure 8:
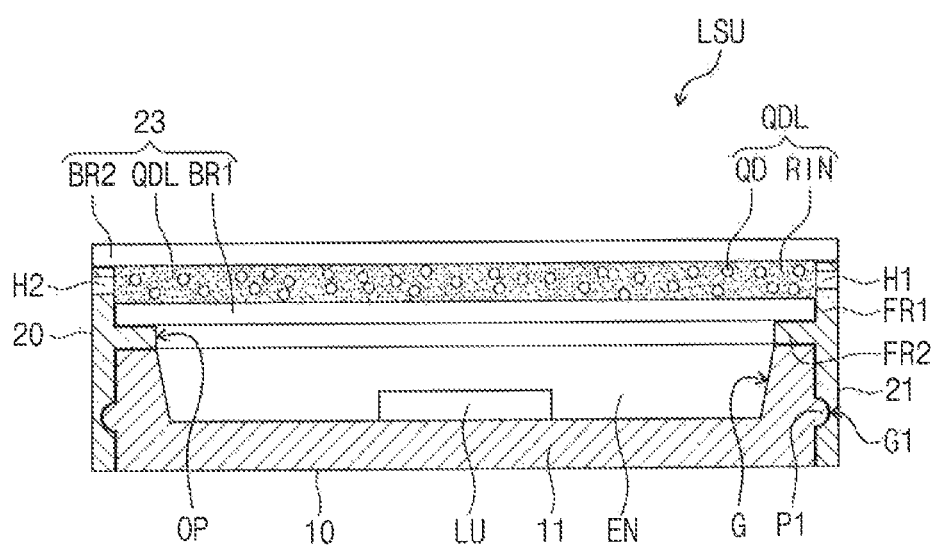
FIG. 8 is a cross-sectional view of the light source unit shown in FIG. 7.

FIG. 7 is an exploded perspective view showing a light source unit of a light source according to an exemplary embodiment of the present invention and FIG. 8 is a cross-sectional view showing the light source unit shown in FIG. 7, which is taken along a line corresponding to the line I-I' shown in FIG. 2.

The light source unit LSU shown in FIG. 7 has the same structure and function as those of the light source unit LSU shown in FIG. 2 except for the connection configuration between the light emitting device 10 and the quantum-dot device 20. Accordingly, hereinafter the connection configuration between the light emitting device 10 and the quantum-dot device 20 will be described in more detail.

Referring to FIGS. 7 and 8, the light emitting device 10 may include a first case 11, a recess G, a light emitting unit LU, a sealing member EN, and a protrusion portion P1.

The first case 11, the recess G, the light emitting unit LU, and the sealing member EN are the same as the first case 11, the recess G, the light emitting unit LU, and the sealing member EN shown in FIG. 2, and thus details thereof will be omitted.

The firs protrusion portion P1 may protrude outward from a lower portion of the side surface of the first case 11. The first protrusion P1 may extend along the side surface of the first case 11 when viewed in a plan view.

The quantum-dot device 20 may include a second case 21 and a quantum-dot member 23. The configuration of the quantum-dot member 23 is the same as that of the quantum-dot member 23 shown in FIG. 2, and thus details thereof will be omitted.

The second case 21 may have a frame shape. The second case 21 may include a plastic resin and may be formed by an injection molding method, a compression molding method, or an extrusion molding method, for example.

The second case 21 may include a first frame FR1, a second frame FR2, an opening portion OP, a first engaging recess G1, a first hole H1, and a second hole H2. The configurations of the opening portion OP, the first hole H1, and the second hole H2 are the same as those of the opening portion OP, the first hole H1, and the second hole H2 shown in FIG. 2, and thus details thereof will be omitted.

The first frame FR1 may have a frame shape. The second frame FR2 may be connected to the inner side surface of the first frame FR1 and may extend vertically with respect to the inner side surface of the first frame FR1.

The light emitting device 10 may be disposed under the second frame FR2 and may be disposed in the first frame FR1. The quantum-dot member 20 may be disposed on the second frame FR2. A predetermined portion of the quantum-dot member 20 may be disposed in the first frame FR1.

The first engaging recess G1 may be formed by recessing a portion of the inner side surface of the first frame FR1 toward an outer side surface of the first frame FR1. The first engaging recess G1 may be disposed under the second frame FR2. The first engaging recess G1 may correspond with the first protrusion portion P1. Unlike the cross-sectional view shown in FIG. 8, the first engaging recess G1 may be formed along the inner side surface of the first frame FR1 when viewed in a plan view.

The first protrusion portion P1 may be inserted into the first engaging recess G1, and the quantum-dot device 20 may be connected to the light emitting device 10.

As described above, the second case 21 may include the plastic resin and may have flexibility to be bent. The quantum-dot device 20 may be attached to and detached from the light emitting device 10 by the first protrusion portion P1 and the first engaging recess G1.

The quantum-dot device 20 may be connected to the light emitting device 10 after the light emitting device 10 is connected to the substrate SUB by the reflow process. The quantum-dot device 20 might not be affected by heat applied to the adhesive member during the reflow process. The quantum-dot device 20 might not be damaged.

The separate fixing member used to fix the quantum-dot member 23 might not be used. The heat used to cure the fixing member might not be applied to the quantum-dot device 20. The quantum-dot device 20 might not be damaged.

For example, the light source LS according to exemplary embodiments of the present invention may prevent the quantum-dot member 20 from being damaged.

Figure 9:
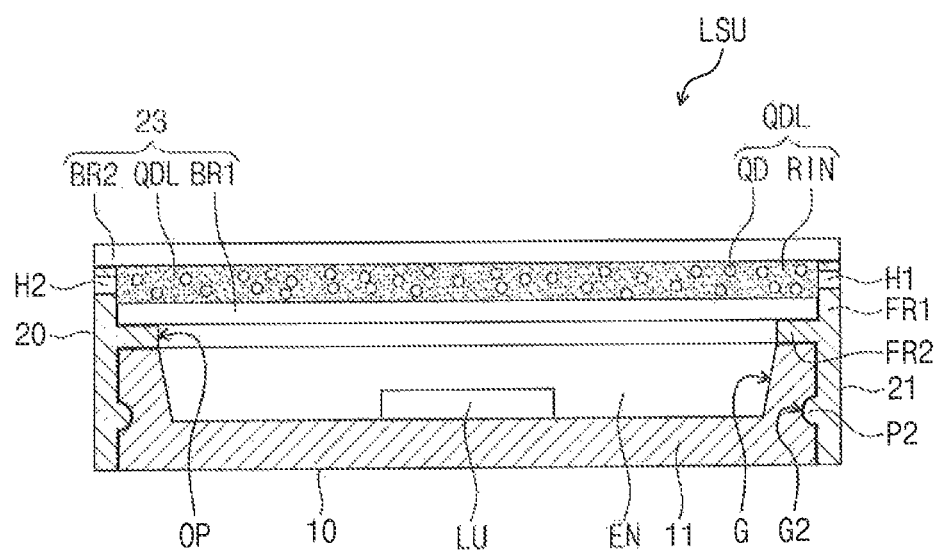
FIG. 9 is a cross-sectional view showing a light source unit of a light source according to an exemplary embodiment of the present invention.

FIG. 9 is a cross-sectional view showing a light source unit of a light source according to an exemplary embodiment of the present invention, which is taken along a line corresponding to the line I-I' shown in FIG. 2.

The light source unit LSU shown in FIG. 9 has the same structure and function as those of the light source unit LSU shown in FIG. 8 except that the light emitting device 10 may be connected to the quantum-dot device 20 by a second protrusion portion P2 and a second engaging recess G2. Accordingly, hereinafter the second protrusion portion P2 and the second engaging recess G2 will be described in more detail.

Referring to FIG. 9, the second engaging recess G2 may be formed by recessing a portion of the lower portion of the side surface of the first case 11 toward the inner side surface of the first case 11. The second engaging recess G2 may extend along the side surface of the first case 11 when viewed in a plan view.

The second protrusion portion P2 may protrude from the lower portion of the inner side surface of the first case 11 toward inside of the first frame FR1. The second protrusion portion P2 may be disposed under the second frame FR2. The second protrusion portion P2 may correspond with the second engaging recess G2. The second protrusion portion P2 may extend along the inner side surface of the first frame FR1 when viewed in a plan view.

The second protrusion portion P2 may be inserted into the second engaging recess G2, and the quantum-dot device 20 may be connected to the light emitting device 10.

As described above, the second case 21 may include the plastic resin and may have flexibility to be bent. The quantum-dot device 20 may be attached to and detached from the light emitting device 10 by the second protrusion portion P2 and the second engaging recess G2.

The quantum-dot device 20 may be connected to the light emitting device 10 after the light emitting device 10 is connected to the substrate SUB by the reflow process. The quantum-dot device 20 might not be damaged. The separate fixing member used to fix the quantum-dot member 23 might not be used. The quantum-dot device 20 might not be damaged.

The light source LS according to exemplary embodiments of the present invention may prevent the quantum-dot member 20 from being damaged.

Figure 10:
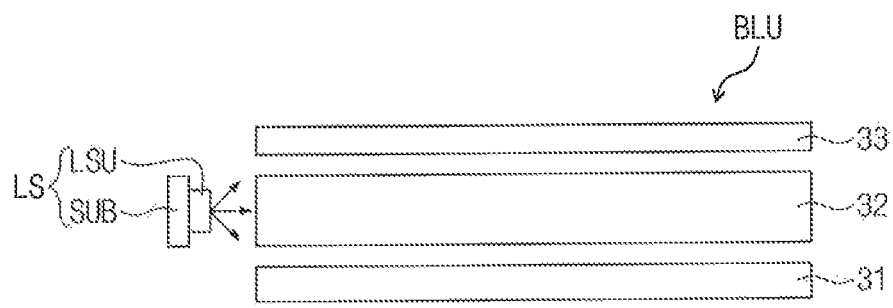
FIGS. 10 and 11 are views showing backlight units each including one of the light sources shown in FIGS. 2, 7, and/or 9.
Figure 11:
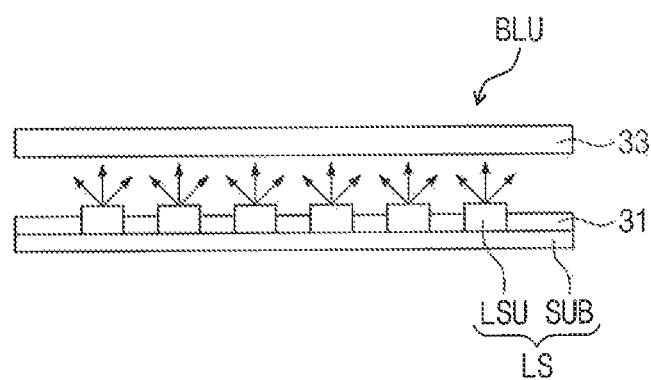

FIGS. 10 and 11 are views showing backlight units each including one of the light sources shown in FIGS. 2, 7, and/or 9.

FIG. 10 shows an edge-illumination type backlight unit BLU and FIG. 11 shows a direct-illumination type backlight unit BLU. In FIGS. 10 and 11, the same elements may be assigned with the same reference numerals.

Referring to FIG. 10, the edge-illumination type backlight unit BLU may include a light source LS, a reflective plate 31, a light guide plate 32, and an optical sheet 33. The light source LS may include the substrate SUB and the light source units LSU mounted on the substrate SUB.

The light source units LSU may be disposed adjacent to a side portion of the light guide plate 32 and may provide light to the light guide plate 32. For example, the light source units LSU may provide white light to the light guide plate 32.

The light guide plate 32 may receive light from the light source units LSU and may guide the received light to allow the light to travel to a display panel (not shown) disposed above the backlight unit BLU.

The reflective plate 31 may be disposed under the light guide plate 32 and may reflect the light traveling downward from the light guide plate 32, and light reflected by the reflective plate 31 may pass through the light guide plate 32 again.

The optical sheet 33 may include a diffusion sheet (not shown) and a prism sheet (not shown) disposed on the diffusion sheet. The diffusion sheet may diffuse light exiting from the light guide plate 32.

The prism sheet may condense the light diffused by the diffusion sheet to allow the diffused light to travel in a direction vertical to a flat surface thereof. Light passing through the prism sheet may have a uniform brightness distribution and may be transmitted to the display panel (not shown) disposed on the backlight unit BLU.

Referring to FIG. 11, the direct-illumination type backlight unit BLU may include a light source LS, a reflective plate 31, and/or an optical sheet 33. The light source LS may include the substrate SUB and the light source unit LSU mounted on the substrate SUB.

The reflective plate 31 may be disposed on the substrate SUB and may include a plurality of insertion holes H. The light source units LSU may be inserted into the insertion holes H of the reflective plate 31. The light source units LSU may emit light to the optical sheet 33. For example, the light source units LSU may emit white light to the optical sheet 33.

The reflective plate 31 may reflect light emitted from the light source units LSU toward the reflective plate 31, and the reflected light may travel in an upward direction.

The diffusion sheet of the optical sheet 33 may diffuse light emitted from the light source units LSU. The prism sheet of the optical sheet 33 may condense light diffused by the diffusion sheet and the diffused light may travel in a direction vertical to a flat surface thereof.

As described above, the quantum-dot device 20 may be attached to and detached from the light emitting device 10. The quantum-dot device 20 may be connected to the light emitting device 10 after the light emitting device 10 is connected to the substrate SUB by the reflow process. The separate fixing member used to fix the quantum-dot member 23 might not be used. The quantum-dot device 20 might not be damaged.

The backlight unit BLU including the light source LS according to exemplary embodiments of the present invention may prevent the quantum-dot member 20 from being damaged.

Figure 12:
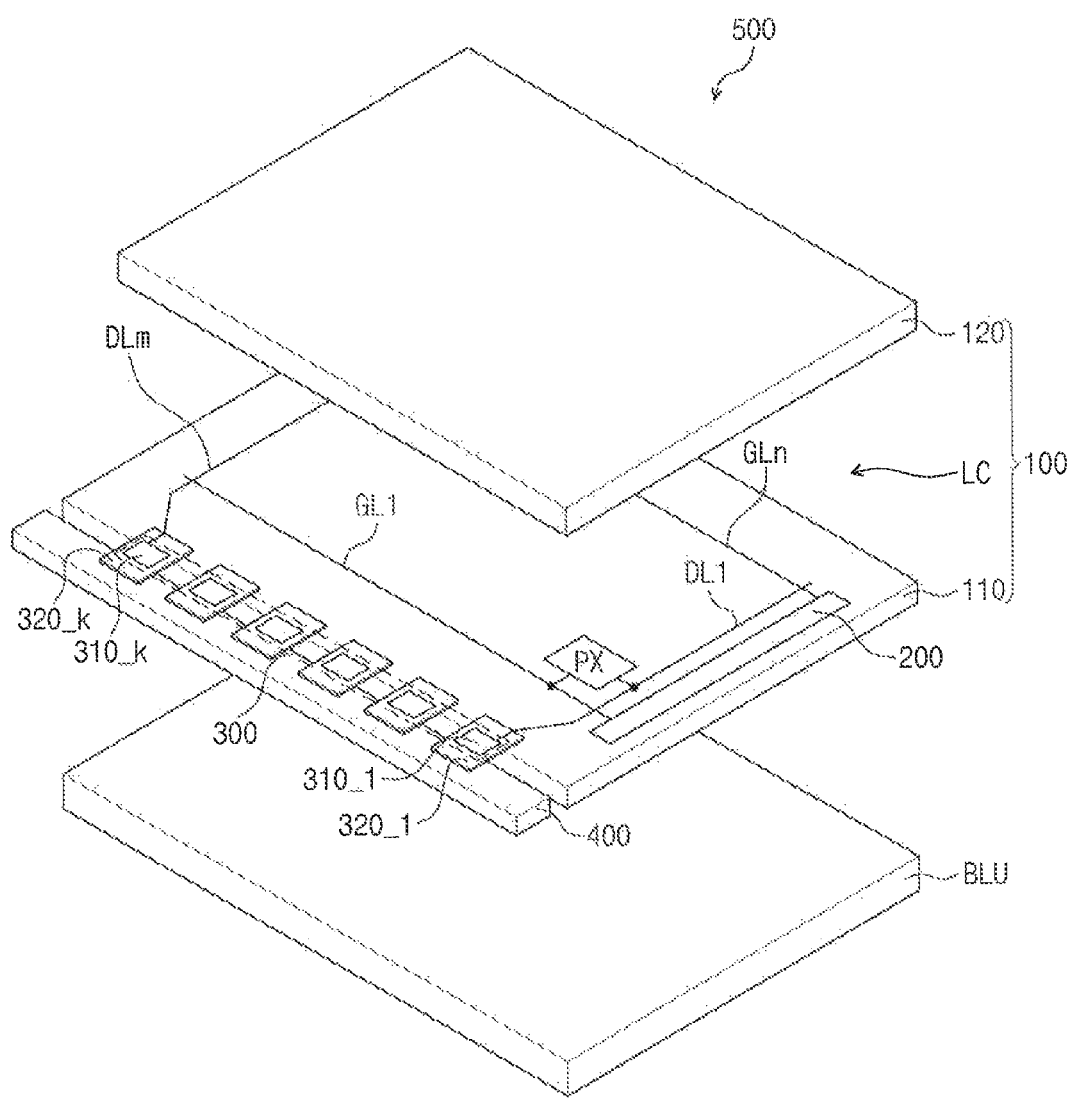
FIG. 12 is a view showing a display device including one of the backlight units shown in FIGS. 10 and 11.

FIG. 12 is a view showing a display device including one of the backlight units shown in FIGS. 10 and 11.

For convenience of explanation, FIG. 12 shows only one pixel PX, but the display device may include a plurality pixels PX arranged in areas defined in association with gate lines GL1 to GLn and data lines DL1 to DLm crossing the gate lines GL1 to GLn.

Referring to FIG. 12, a display device 500 may include a display panel 100, a gate driver 200, a data driver 300, a driving circuit board 400, and a backlight unit BLU.

The display panel 100 may include a thin film transistor substrate 110 including the pixels PX, a color filter substrate 120 facing the thin film transistor substrate 110 and including a common electrode (not shown), and a liquid crystal layer LC interposed between the thin film transistor substrate 110 and the color filter substrate 120. Each of the pixels PX may be connected to a corresponding gate line of the gate lines GL1 to GLn, for example, and a corresponding data line of the data lines DL1 to DLm.

Each pixel PX may include a pixel electrode and a thin film transistor connected to the pixel electrode. The thin film transistor may receive a data voltage through the corresponding data line in response to a gate signal provided through the corresponding gate line. The data voltage may be applied to the pixel electrode.

The gate driver 200 may generate gate signals in response to a gate control signal provided from a timing controller mounted on the driving circuit board 400. The gate signals may be sequentially applied to the pixels PX in a row unit. The pixels PX may be driven in row units.

The data driver 300 may receive image signals and a data control signal from the timing controller. The data driver 300 may generate analog data voltages corresponding to the image signals in response to the data control signal. The data driver 300 may apply the data voltages to the pixel PX through the data lines DL1 to DLm, for example.

The data driver 300 may include a plurality of source driving chips 310_1 to 310_k. The source driving chips 310_1 to 310_k may be mounted on flexible printed circuit boards 320_1 to 320_k, respectively, and may be connected to the driving circuit board 400 and the thin film transistor substrate 110.

According to an exemplary embodiment of the present invention, the source driving chips 310_1 to 310_k may be respectively mounted on the flexible printed circuit boards 320_1 to 320_k by a tape carrier package (TCP) scheme, but the present invention is not limited thereto or thereby. The source driving chips 310_1 to 310_k may be mounted on a first non-display area by a chip on glass (COG) scheme.

Color filters may be disposed on the color filter substrate 120. Each color filter may include a color pixel that represents a red, green, or blue color.

The backlight unit BLU may be disposed at a rear side of the display panel 100 to provide the light to the display panel 100. As described above, the light provided to the display panel 100 from the backlight unit BLU may be white light.

The data voltages may be applied to the pixel electrodes by the thin film transistors and a common voltage may be applied to the common electrode. An electric field may be formed between the common electrode and the pixel electrode by a voltage difference between the common voltage applied to the common electrode and the data voltages. For example, due to the electric field, an arrangement of liquid crystal molecules of the liquid crystal layer LC may be changed. The transmittance of light passing through the liquid crystal layer LC may be controlled by the variation in arrangement of the liquid crystal molecules, and desired images may be displayed on the display panel 100.

While the present invention has been particularly shown and described with reference to exemplary embodiments thereof, it will be understood by those of ordinary skill in the art that various changes in form and detail may be made therein without departing from the spirit and scope of the present invention.

What is claimed is:

1. A light source, comprising:
   a substrate;
   a plurality of light emitting devices disposed on the substrate, wherein each of the light emitting devices comprises a first case including a recess, and wherein each of the light emitting devices is configured to generate a first light; and
   a plurality of quantum-dot devices respectively disposed on the light emitting devices, wherein the quantum-dot devices are configured to convert the first light to a second light, and wherein the quantum-dot devices are configured to be attached to and detached from the light emitting devices, respectively,
   wherein each of the quantum-dot devices comprises a second case having a frame shape, a plurality of engaging members connected to a lower portion of the second case and protruded downward, and a quantum-dot member including a first barrier layer, a second barrier layer, and a quantum-dot layer disposed between the first and second barrier layers, and the first barrier layer and the quantum-dot layer are disposed in the second case, wherein the second case comprises a first hole through a first side wall of the second case and a second hole through a second side wall of the second case facing the first side wall of the second case, and wherein the first hole is substantially aligned with the second hole.

2. The light source of claim 1, wherein each of the light emitting devices comprises:
   a light emitting unit disposed in the recess, wherein the light emitting unit is configured to generate the first light; and
   a plurality of engaging recesses disposed in a lower portion of the first case.

3. The light source of claim 2, wherein the quantum-dot member is configured to convert the first light to the second light, and wherein the engaging members are disposed in the engaging recesses, respectively.

4. The light source of claim 3, wherein the second case comprises:
   a first frame having a frame shape;
   a second frame connected to a lower portion of an inner side surface of the first frame and extending vertically with respect to the inner side surface of the first frame;
   an opening portion formed through the second frame, wherein a size of the opening portion is larger than a size of the recess of the first case, the recess is overlapped with the opening portion, the first case is disposed under the second frame, and the first barrier layer and the quantum-dot layer are disposed on the second frame and disposed in the first frame.

5. The light source of claim 3, wherein each of the engaging members comprises:
   a first extension portion connected to the lower portion of the second case and extending in a downward direction; and
   a second extension portion connected to a lower portion of an inner side surface of the first extension portion and extending vertically with respect to the inner side surface of the first extension portion, wherein the inner side surface of the first extension portion, which is not connected to the second extension portion is in contact with a side surface of the first case at an upper portion of the engaging recess, and the second extension portion is disposed in a corresponding engaging recess of the engaging recesses.

6. The light source of claim 3, wherein the first light comprises a blue light, the second light comprises a white light, and the second case and the engaging members comprise a plastic resin.

7. The light source of claim 1, wherein each of the light emitting devices comprises:
   a light emitting unit disposed in the first case, wherein the light emitting unit is configured to generate the first light; and
   a first protrusion portion protruded outward from a lower portion of a side surface of the first case, wherein the first protrusion portion extends along the side surface of the first case.

8. The light source of claim 7, wherein each of the quantum-dot devices comprises:
   a first frame having a frame shape;
   a second frame connected to an inner side surface of the first frame, wherein the second frame extends vertically with respect to the inner side surface of the first frame; and
   an engaging recess disposed under the second frame and recessed from a lower portion of the inner side surface of the first frame toward an outer side surface of the first frame; and
   a quantum-dot member disposed on the second frame and disposed in the first frame, wherein the quantum-dot member is configured to convert the first light to the second light, the light emitting devices are disposed at the lower portion of the second frame and disposed in the first frame, the engaging recess extends along the inner side surface of the first frame, and the first protrusion portion is inserted into the engaging recess.

9. The light source of claim 1, wherein each of the light emitting devices comprises:
   a light emitting unit disposed in the first case, wherein the light emitting unit is configured to generate the first light; and
   an engaging recess recessed from a lower portion of a side surface of the first case toward an inside of the first case.

10. The light source of claim 9, wherein each of the quantum-dot devices comprises:
    a first frame having a frame shape;
    a second frame connected to an inner side surface of the first frame and extending vertically with respect to the inner side surface of the first frame; and
    a second protrusion portion disposed on a lower portion of the second frame, wherein the second protrusion portion is protruded from a lower portion of the inner side surface of the first frame toward an inside of the first frame,
    wherein the light emitting devices are disposed at the lower portion of the second frame and disposed in the first frame, the second protrusion portion extends along the inner side surface of the first frame, and the second protrusion portion is disposed in the engaging recess.

11. A method of manufacturing a light source, comprising:
    connecting a plurality of light emitting devices to a substrate, wherein each of the light emitting devices comprises a first case, and wherein the light emitting devices are configured to generate a first light;
    manufacturing of a quantum-dot devices, wherein the quantum-dot devices comprise a second case including a first frame having a frame shape, a first hole formed through a first side portion of the first frame and a second hole formed through a second side portion of the first frame, a plurality of engaging members connected to a lower portion of the second case and protruded downward, and a quantum-dot member including a quantum-dot layer;
    disposing quantum-dot devices on the light emitting devices to convert the first light to a second light, wherein the quantum-dot devices include engaging members; and
    connecting the quantum-dot devices to the light emitting devices, respectively, with the engaging members, wherein the quantum-dot devices are attached to and detached from the light emitting devices, respectively, by the engaging members,
    wherein the manufacturing of the quantum-dot devices comprises:
    filling a resin solution containing a plurality of quantum dots in a first space defined in the first frame, and
    curing the resin solution to form the quantum-dot layer,
    wherein the filling of the resin solution in the first space comprises:
    depositing the resin solution in the first space through the first hole; and
    discharging air in the first space through the second hole.

12. The method of claim 11, wherein at least one of the light emitting devices comprises:
    a light emitting unit disposed in the first case, wherein the light emitting unit is configured to generate the first light; and
    a plurality of engaging recesses disposed in the first case.

13. The method of claim 12, wherein the quantum-dot member comprises a first barrier layer, a second barrier layer, and the quantum-dot layer disposed between the first and second barrier layers, wherein the quantum-dot member is configured to convert the first light to the second light, the engaging members are inserted into the engaging recesses, respectively, and the first barrier layer and the quantum-dot layer are disposed in the second case.

14. The method of claim 13, wherein the second case further comprises:
    a second frame connected to a lower portion of an inner side surface of the first frame and extending vertically with respect to the inner side surface of the first frame; and
    an opening portion formed through the second frame,
    wherein a size of the opening portion is larger than a size of a recess of the first case, the recess is overlapped with the opening portion, the first case is disposed under the second frame, and the first barrier layer and the quantum-dot layer are disposed on the second frame and disposed in the first frame.

15. The method of claim 14, wherein the manufacturing of the quantum-dot devices further comprises:
    disposing the first barrier layer on an upper surface of the second frame; and
    disposing the second barrier layer on an upper surface of the first frame,
    wherein the first space is defined between the first barrier layer and the second barrier layer.

16. The method of claim 13, wherein at least one of the engaging members comprises:
    a first extension portion connected to the lower portion of the second case and extending in a downward direction; and
    a second extension portion connected to a lower portion of an inner side surface of the first extension portion and extending vertically with respect to the inner side surface of the first extension portion, the inner side surface of the first extension portion is in contact with a side surface of the first case at an upper portion of the engaging recess, and the second extension portion is inserted into a corresponding engaging recess of the engaging recesses.

17. A method of manufacturing a light source, comprising:
    connecting a plurality of light emitting devices to a substrate, wherein the light emitting devices are configured to generate a first light;
    disposing quantum-dot devices on the light emitting devices to convert the first light to a second light, wherein the quantum-dot devices include engaging members;
    connecting the quantum-dot devices to the light emitting devices, respectively, with the engaging members, wherein the quantum-dot devices are attached to and detached from the light emitting devices, respectively, by the engaging members, wherein at least one of the light emitting devices comprises:
    a first case;
    a light emitting unit disposed in the first case, wherein the light emitting unit is configured to generate the first light; and
    a plurality of engaging recesses disposed in the first case, wherein at least one of the quantum-dot devices comprises:
    a second case having a frame shape;
    a plurality of engaging members connected to a lower portion of the second case and protruded downward; and a quantum-dot member including a first barrier layer, a second barrier layer, and a quantum-dot layer disposed between the first and second barrier layers, wherein the quantum-dot member is configured to convert the first light to the second light, the engaging members are inserted into the engaging recesses, respectively, and the first barrier layer and the quantum-dot layer are disposed in the second case, wherein the second case comprises:
a first frame having the frame shape;
a second frame connected to a lower portion of an inner side surface of the first frame and extending vertically with respect to the inner side surface of the first frame;
an opening portion formed through the second frame;
a first hole formed through a first side portion of the first frame and overlapped with the quantum-dot layer; and
a second hole formed through a second side portion of the first frame and overlapped with the quantum-dot layer, a size of the opening portion is larger than a size of a recess of the first case, the recess is overlapped with the opening portion, the first case is disposed under the second frame, and the first barrier layer and the quantum-dot layer are disposed on the second frame and disposed in the first frame; and
manufacturing the quantum-dot devices, wherein the manufacturing of the quantum-dot devices comprises:
disposing the first barrier layer on an upper surface of the second frame;
disposing the second barrier layer on an upper surface of the first frame;
filling a resin solution containing a plurality of quantum dots in a first space defined between the first barrier layer and the second barrier layer; and
curing the resin solution to form the quantum-dot layer in the first space,
wherein the filling of the resin solution in the first space comprises:
depositing the resin solution in the first space through the first hole; and
discharging air in the first space through the second hole.

18. A backlight unit, comprising:
a light source configured to convert a first light to a second light; and
an optical sheet that diffuses the second light and condenses the second light in an upward direction, the light source comprising:
a substrate;
a plurality of light emitting devices connected to the substrate, wherein each of the light emitting devices comprises a first case including a recess, and wherein each of the plurality of light emitting devices is configured to generate the first light; and
a plurality of quantum-dot devices respectively disposed on the light emitting devices, wherein each of the plurality of quantum-dot devices is configured to convert the first light to the second light, and wherein the quantum-dot devices are configured to be attached to and detached from the light emitting devices, respectively,
wherein each of the quantum-dot devices comprises a second case having a frame shape, a plurality of engaging members connected to a lower portion of the second case and protruded downward, and a quantum-dot member including a first barrier layer, a second barrier layer, and a quantum-dot layer disposed between the first and second barrier layers, and the first barrier layer and the quantum-dot layer are disposed in the second case, wherein the second case comprises a first hole through a first side wall of the second case and a second hole through a second side wall of the second case facing the first side wall of the second case, wherein the first hole faces the second hole through the quantum-dot member, and wherein the first hole is substantially aligned with the second hole.

19. The backlight unit of claim 18, wherein each of the light emitting devices comprises:
a light emitting unit disposed in the recess of the first case, wherein the light emitting unit is configured to generate the first light; and
a plurality of engaging recesses recessed from a lower portion of the first case to an upper portion of the first case, which is adjacent to a side surface of the first case,
wherein the quantum-dot member is configured to convert the first light to the second light, and wherein each of the engaging members comprises:
a first extension portion connected to the lower portion of the second case and extending in a downward direction; and
a second extension portion connected to a lower portion of an inner side surface of the first extension portion and extending vertically with respect to the inner side surface of the first extension portion, the inner side surface of the first extension portion is in contact with a side surface of the first case at an upper portion of the engaging recess, and the second extension portion is disposed in a corresponding engaging recess of the engaging recesses.

20. The backlight unit of claim 19, wherein the second case comprises:
a first frame having a frame shape;
a second frame connected to a lower portion of an inner side surface of the first frame and extending vertically with respect to the inner side surface of the first frame; and
an opening portion formed through the second frame,
wherein a size of the opening portion is larger than a size of the recess, the recess is overlapped with the opening portion, the first case is disposed under the second frame, and the first barrier layer and the quantum-dot layer are disposed on the second frame and disposed in the first frame.

21. A quantum-dot device, comprising:
a case comprising a first frame and a second frame, wherein the second frame is connected to a lower portion of an inner side surface of the first frame and the second frame extends vertically with respect to the inner side surface of the first frame;
an opening portion formed in a center of the case;
a quantum-dot member comprising a quantum-dot layer, a first barrier layer and a second barrier layer disposed on the second frame;
a first hole through a first side wall of the case and a second hole through a second side wall of the case facing the first side wall of the case, wherein the first hole faces the second hole through the quantum-dot member, and wherein the first hole is substantially aligned with the second hole; and
an engaging member comprising a first extension portion connected to a bottom portion of the case and a second extension portion connected to the first extension portion, wherein the engaging member is configured to be attached to and detached from a light-emitting device,
wherein the quantum-dot layer is disposed between the first and second barrier layers.

22. The quantum-dot device of claim 21, wherein the quantum dot device is configured to convert a first light to a second light.

23. The quantum-dot device of claim 21, wherein the quantum dot device is configured to convert a blue light to a white light.

24. The quantum-dot device of claim 21, wherein the engaging members include a plastic resin.

25. The quantum-dot device of claim 21, wherein the first extension portion extends in a downward direction and the second extension portion extends perpendicularly with respect to the first extension portion towards the opening of the case.

* * * * *